United States Patent
Reid et al.

(10) Patent No.: US 9,841,451 B2
(45) Date of Patent: Dec. 12, 2017

(54) ZONE FAULT DETECTION METHOD AND SYSTEM FOR ELECTRIC VEHICLE CHARGING SYSTEMS

(71) Applicant: SCHNEIDER ELECTRIC USA, INC., Palatine, IL (US)

(72) Inventors: Paul Andrew Reid, Cedar Rapids, IA (US); Jeffrey Owen Sharp, Lexington, KY (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 57 days.

(21) Appl. No.: 14/774,872

(22) PCT Filed: Mar. 15, 2013

(86) PCT No.: PCT/US2013/032344
§ 371 (c)(1),
(2) Date: Sep. 11, 2015

(87) PCT Pub. No.: WO2014/143013
PCT Pub. Date: Sep. 18, 2014

(65) Prior Publication Data
US 2016/0033565 A1    Feb. 4, 2016

(51) Int. Cl.
*G01R 31/00*    (2006.01)
*G01R 31/02*    (2006.01)
(Continued)

(52) U.S. Cl.
CPC .......... *G01R 31/006* (2013.01); *B60L 3/0046* (2013.01); *B60L 3/0069* (2013.01);
(Continued)

(58) Field of Classification Search
CPC combination set(s) only.
See application file for complete search history.

(56) References Cited

U.S. PATENT DOCUMENTS 9,509,144 B1 * 11/2016 Mellon, Jr. ............... H02J 4/00
2003/0107381 A1 * 6/2003 Wang ..................... H02H 3/283
324/522

(Continued)

FOREIGN PATENT DOCUMENTS

WO    2012/127649 A1    9/2012

OTHER PUBLICATIONS

International Search Report and Written Opinion dated Jun. 21, 2013 in International Application No. PCT/US13/32344, 10 pages.

*Primary Examiner* — Vincent Q Nguyen
(74) *Attorney, Agent, or Firm* — Locke Lord LLP (57) ABSTRACT

A system for detecting faults in an electric vehicle charging system includes an electric vehicle supply equipment (EVSE) coupled to an electric vehicle via a cable. The EVSE includes a first charging circuit interrupting device (CCID) configured to detect faults at let-go levels between an ungrounded conductor in the cable and an external (or unintended) ground. The first CCID is also configured to detect faults above leakage current levels between a chassis of the vehicle and a power storage device of the vehicle. A second CCID is included in the cable or the vehicle to detect faults at let-go levels between an ungrounded conductor in the cable and the chassis. The system maintains grounding continuity between the electric vehicle and ground. The system thus provides protection at let-go levels while allowing a leakage current in the vehicle to be detected at a higher level for nuisance trip avoidance.

20 Claims, 5 Drawing Sheets

(51) Int. Cl.
  *B60L 3/00* (2006.01)
  *B60L 3/04* (2006.01)
  *B60L 11/18* (2006.01)
  *G01R 31/08* (2006.01)

(52) U.S. Cl.
  CPC ............ *B60L 3/04* (2013.01); *B60L 11/1818* (2013.01); *B60L 11/1846* (2013.01); *B60L 11/1877* (2013.01); *G01R 31/025* (2013.01); *G01R 31/083* (2013.01); *B60L 2200/12* (2013.01); *B60L 2200/18* (2013.01); *B60L 2200/36* (2013.01); *B60L 2230/12* (2013.01); *G01R 31/08* (2013.01); *Y02T 10/7005* (2013.01); *Y02T 10/705* (2013.01); *Y02T 10/7088* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(56) References Cited

U.S. PATENT DOCUMENTS

| | | |
|---|---|---|
| 2007/0284159 A1 | 12/2007 | Takami et al. |
| 2011/0106329 A1* | 5/2011 | Donnelly .................. B60L 3/12 700/291 |
| 2011/0169447 A1 | 7/2011 | Brown et al. |
| 2012/0161797 A1 | 6/2012 | Hein |
| 2014/0002011 A1 | 1/2014 | Ang et al. |

\* cited by examiner

ZONE FAULT DETECTION METHOD AND SYSTEM FOR ELECTRIC VEHICLE CHARGING SYSTEMS

FIELD OF THE INVENTION

The present disclosure relates generally to electric vehicle charging systems and, more particularly, to a zone fault detection method and system for electric vehicle charging systems.

BACKGROUND

Electric vehicles utilize batteries or other electrical storage devices to store electrical energy that is used to provide power to the electric vehicles' drive train. When the stored energy in the battery is depleted, the battery must be recharged. An electric vehicle supply equipment (EVSE) is utilized to connect electric vehicles to an electrical distribution system for the purpose of charging the battery. An EVSE may also be referred to as a supply equipment, a vehicle charger, a charging station, or a charger.

One potential problem with electric vehicles is that high voltages and currents are generally required to charge the batteries in the electric vehicles. Such high voltages and currents present serious safety concerns. For example, a ground fault can occur when an operator of the EVSE inadvertently provides an unintended conduction path to ground, creating an electrical shock hazard. There are a number of potential causes for a ground fault such as, for example, the insulation on a wire becoming damaged or a component of the EVSE coming into contact with water or other liquids. Additionally, the metallic surfaces and components of the electric vehicle are potential sources for an electrical shock hazard. Indeed, because the electric vehicle is insulated from the ground due to the vehicle's rubber tires, the electric vehicle itself can present a hazard if not properly grounded during recharging of the battery.

To address such safety concerns, a number of standards have been published specifying safety features for an EVSE. For example, the UL 2231 standard requires that the EVSE include a charging circuit interrupting device (CCID) to disconnect the source of power if a potential ground fault condition is detected. In one implementation, the EVSE includes a single CCID configured to have a rated trip threshold of 5 mA (i.e., a "CCID5") to protect the load-side of the charging system at a level below a maximum "let-go" current level. A maximum "let-go" current level is the current level at which the electricity causes a person's muscles to contract to the point that the person loses control of their muscles and, thus, cannot let go of a conductor until the current is removed. Accordingly, when a system is protected below the maximum let-go current level (i.e., at let-go current levels), the risk of serious bodily harm is substantially reduced. While the maximum let-go current level differs for each person, an average maximum let go level is generally in a range from approximately 9 mA to approximately 15 mA.

Unfortunately, conventional systems employing a CCID5 suffer from a significant drawback. For various reasons (e.g., degraded insulation, accumulated dirt or salt, corrosion, natural leakage through EMI related components, etc.), current can leak from the electrical components within the electric vehicle at leakage current levels above the 5 mA trip threshold of the CCID5. Although these leakage currents may be safe (due to grounding of the vehicle chassis), they can cause inconvenient and unacceptable nuisance tripping that interrupts the recharging of the electric vehicle. As a result, the UL 2231 standard alternatively provides for protection utilizing a single CCID20, which has a rated trip threshold level of 20 mA (i.e., a trip threshold level that is generally higher than most nonhazardous leakage currents). Because the rated trip threshold level of the CCID20 is above the maximum let-go current level, the UL 2231 standard requires that the system where the grounding integrity may be compromised also include a ground monitor that is configured to cause the system to interrupt the power if an inadequate connection of the grounding system is detected. That is, the verification of a connection of the electric vehicle and EVSE to ground protects a person from a ground fault occurring internally within the electric vehicle.

Significantly, however, the conventional CCID20 system does not protect a person from a ground fault occurring externally to the electric vehicle at let-go current levels. Rather, the CCID20 system detects a ground fault external to the electrical vehicle only after the ground fault exceeds the 20 mA trip threshold of the CCID20, which is generally above the maximum let-go current level. Thus, with conventional EVSE protection systems, one must choose between a system that experiences excessively inconvenient nuisance tripping and a system that does not protect an operator from ground faults external to the electric vehicle at let-go current levels.

BRIEF SUMMARY

The present disclosure provides new approaches to protecting operators of an EVSE from ground faults, overcoming the drawbacks of conventional EVSE protection systems and methods. According to aspects of the present disclosure, the load side of the system is divided into three distinct zones in which a potential ground fault can occur. The zones are each defined by where a potential ground fault originates and the conduction path that the potential ground fault takes to return to a source. A first zone includes potential ground faults that originate from an electrical component within the electric vehicle (e.g., a battery) and return to the source via a chassis of the electric vehicle. A second zone includes potential ground faults that originate from a cable coupling an EVSE to the electric vehicle and return to the source via the chassis of the electric vehicle. A third zone includes potential ground faults that originate from the cable and return to the source via a ground external to the system.

The present disclosure provides new approaches to protecting operators of an EVSE from ground faults, overcoming the drawbacks of conventional EVSE protection systems and methods. In particular, the systems and methods of the present disclosure protect an operator at let-go levels for ground faults occurring not only internally but also externally to the electric vehicle, while also mitigating nuisance tripping due to leakage current, by handling the ground faults differently depending on which one of three different zones the ground faults occur in.

Figure 1:
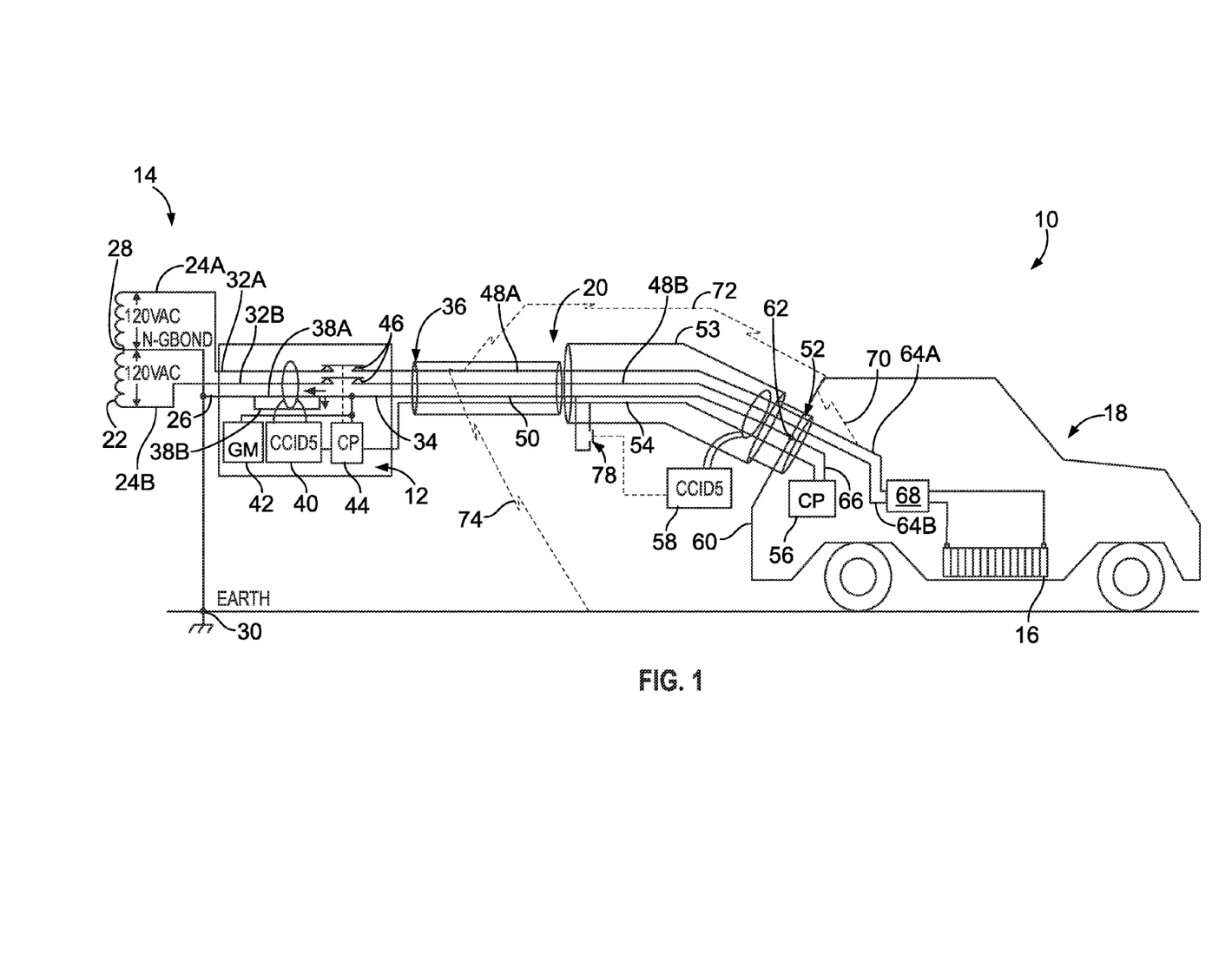
FIG. 1 is a functional diagram of an exemplary zone fault detection system according to aspects of the present disclosure.

A first fault zone includes potential ground faults that occur internally to the electric vehicle. That is, the ground faults of the first fault zone originate from an electrical component within the electric vehicle (e.g., a power storage device, an ungrounded conductor, a charge controller, etc.) and return to the system ground via a chassis of the electric vehicle. For example, a ground fault in the first zone can occur if the vehicle's battery becomes connected to the chassis such that a ground fault current passes from the battery to the chassis and then to the system ground (e.g., via a grounded conductor, which is coupled to the chassis). FIG. 1 illustrates an exemplary first ground fault 70 occurring in the first fault zone.

A second fault zone includes potential ground faults that occur externally to the electric vehicle. The potential ground faults of the second zone originate from a cable coupling the EVSE to the electric vehicle and return to the system ground via the chassis of the electric vehicle. For example, a ground fault in the second zone can occur if the operator contacts the cable and also contacts the chassis such that a ground fault current passes from the cable through the operator to the chassis and then to the system ground (e.g., via a grounded conductor in the cable, which is electrically coupled to the chassis). FIG. 1 illustrates an exemplary second ground fault 72 occurring in the second fault zone.

A third fault zone includes different potential ground faults that occur externally to the electric vehicle. The potential ground faults of the third zone originate from the cable and return directly to a ground external to the system (i.e., the ground faults of the third zone do not pass through the chassis to the ground). For example, a ground fault in the third zone can occur if the operator contacts the cable while standing in a wet puddle such that a ground fault current passes from the cable through the operator directly to the ground. FIG. 1 illustrates an exemplary third ground fault 74 occurring in the third fault zone.

According to some aspects of the present disclosure, the systems and methods can detect ground faults and protect operators from ground faults by a first CCID at the EVSE, a second CCID in the cable, and one or more components configured to maintain a continuous connection between the chassis and the system ground. The first CCID and the second CCID monitor conductors of the system and cause an interruption of power from the EVSE to the electric vehicle if a detected current differential on the monitored conductors exceeds a rated trip threshold. Both the first CCID and the second CCID can have rated trip thresholds at let-go current levels.

In the second zone, the second CCID detects ground faults at the rated trip threshold, which is at let-go current levels. An operator is protected from ground faults in the second zone at let-go levels because the second CCID is configured to cause an interruption of the power from the EVSE to the electric vehicle if a ground fault is detected above the rated trip threshold. In the third zone, the first CCID detects and protects against ground faults at the rated trip threshold, which is at let-go current level. An operator is protected from ground faults in the third zone at let-go levels because the first CCID is configured to cause an interruption of the power from the EVSE to the electric vehicle if a ground fault is detected above the rated trip threshold.

The first CCID also detects ground faults in the first zone. However, the ground faults detected in the first zone are detected and protected against differently than the ground faults detected by the first CCID in the third zone to account for potential leakage current. This is because leakage current is conducted through the system in a similar manner to the ground faults occurring in the first zone. Indeed, like ground faults in the first zone, the leakage current is conducted from an electrical component within the electric vehicle to the system ground via the chassis of the electric vehicle. To mitigate nuisance tripping due to the leakage current at levels greater than the rated trip threshold of the first CCID, the EVSE can be configured to effectively increase the trip threshold of the first CCID for currents returning to the system ground in response to the ground faults in the first zone (and, thus, leakage currents as well). The effective trip threshold of the first CCID can be increased by passing a part of the current, which is due to ground faults in the first zone or leakage current, through the first CCID and bypassing another part of the current around the first CCID.

Because the effective trip threshold of the first CCID is increased (possibly above let-go levels), the system includes one or more components configured to ensure that the chassis is continuously connected to the system ground when power is provided to the electric vehicle. In this way, the operator is protected at let-go levels when in contact with the chassis because the system ensures that ground faults in the first zone, which are conducted to the chassis, can be safely directed to the system ground.

According to other aspects of the present disclosure, the systems and methods can detect ground faults and protect operators from ground faults by a first CCID at the EVSE, a second CCID in the cable, a third CCID at the EVSE, and one or more components configured to maintain a continuous connection between the chassis and ground. The first CCID, the second CCID, and the third CCID monitor conductors of the system and cause an interruption of power from the EVSE to the electric vehicle if a detected current differential on the monitored conductors exceeds a rated trip threshold. Both the first CCID and the second CCID can have rated trip thresholds at let-go current levels. The third CCID can have a rated trip threshold at a different current level, which may be higher than the let-go current levels so as to mitigate nuisance tripping due to leakage current.

A ground fault occurring in the first zone is detected by the third CCID, a ground fault occurring in the second zone is detected by the second CCID, and a ground fault occurring in the third zone is detected by the first CCID. An operator is protected from ground faults in the second zone at let-go levels by the second CCID causing an interruption of power from the EVSE to the electric vehicle when the second CCID detects a ground fault above its rated trip threshold (i.e., at a let-go level). Similarly, an operator is protected from ground faults in the third zone at let-go levels by the first CCID causing an interruption of power from the EVSE to the electric vehicle when the first CCID detects a ground fault above its rated trip threshold (i.e., at a let-go level). An operator is protected from ground faults in the first zone at let-go levels by the components configured to cause an interruption to the power if a continuous connection between the electric vehicle and ground is not maintained.

The foregoing and additional aspects and implementations of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

While the present disclosure is susceptible to various modifications and alternative forms, specific embodiments have been shown by way of example in the drawings and will be described in detail herein. It should be understood, however, that the present disclosure is not intended to be limited to the particular forms disclosed. Rather, the invention is to cover all modifications, equivalents, and alternatives falling within the spirit and scope of the present disclosure.

DETAILED DESCRIPTION

Referring to FIG. 1, a functional block diagram of an exemplary zone fault detection system 10 is illustrated in accordance with some aspects of the present disclosure. The system 10 includes an EVSE 12 configured to provide power from a power source 14 to a power storage device 16 in an electric vehicle 18 via a cable 20 and a connector 53.

The power source 14 can include any electrical distribution system configured to provide an alternating current (AC) power. For example, the power source 14 can include an electrical power grid, a generator, and/or other external power source(s). The exemplary power source 14 illustrated in FIG. 1 includes a 240V center tapped transformer 22 coupled to a first ungrounded power-source conductor 24A, a second ungrounded power-source conductor 24B, and a grounded power-source conductor 26 for providing a 240 $V_{AC}$ power to the EVSE 12. The first ungrounded power-source conductor 24A and the second ungrounded power-source conductor 24B provide two phase (hot) conductors for conducting current to the EVSE 12. The grounded power-source conductor 26 is coupled to a center tap 28 of the transformer 22 and a ground 30. It should be understood that, in alternative implementations, the power source 14 can be configured to provide a 120 $V_{AC}$ power (e.g., including one phase conductor), a three-phase power (e.g., including three phase conductors), and/or other electrical powers.

The EVSE 12 can include any suitable components and/or circuitry for providing the electrical power from the power source 14 to the electric vehicle 18. For example, the EVSE 12 can include one or more conductors, transformers, filters, power factor correction circuits, voltage regulators, current regulators, control circuits, switches, combinations thereof, and/or the like. As illustrated in FIG. 1, the EVSE 12 includes a first ungrounded EVSE conductor 32A, a second ungrounded EVSE conductor 32B, and a grounded EVSE conductor 34, which are electrically coupled to the first ungrounded power-source conductor 24A, the second ungrounded power-source conductor 24B, and the grounded power-source conductor 26, respectively. The first ungrounded EVSE conductor 32A, the second ungrounded EVSE conductor 32B, a grounded EVSE conductor 34 are further coupled to a first end 36 of the cable 20.

For reasons that are explained in detail below, the grounded EVSE conductor 34 includes a first grounded EVSE conductor 38A and a second grounded EVSE conductor 38B. The first grounded EVSE conductor 38A and the second grounded EVSE conductor 38B are configured to conduct respective portions of a current on the grounded EVSE conductor 34 from the first end 36 of the cable 20 to the ground 30.

The EVSE 12 further includes a first CCID 40 that is configured to monitor a current differential between the current conducted on the first ungrounded EVSE conductor 32A, the second ungrounded EVSE conductor 32B, and the first grounded EVSE conductor 38A. The first CCID 40 is further configured to cause an interruption of the current on at least one of the ungrounded EVSE conductors 32A, 32B if a detected current differential exceeds a rated trip threshold of the first CCID 40. In the illustrated implementation, the first CCID 40 has a rated trip threshold of 5 mA. The EVSE 12 can further include a ground monitor circuit 42 for verifying a continuity of one or more conductors of the system 10 to the ground 30, an EVSE control pilot circuit 44 for communicatively coupling the EVSE 12 to the electric vehicle 18, and one or more trip mechanisms 46 for interrupting a current conducted on one or more conductors of the system 10. The first CCID 40, the ground monitor circuit 42, the EVSE control pilot circuit 44, and the trip mechanism(s) 46 are described in greater detail below.

As described above, the EVSE 12 is electrically coupled to the cable 20 at the first end 36 of the cable 20. More particularly, the cable 20 includes a first ungrounded cable conductor 48A, a second ungrounded cable conductor 48B, and a grounded cable conductor 50, which are electrically coupled to the first ungrounded EVSE conductor 32A, the second ungrounded EVSE conductor 32B, and the grounded EVSE conductor 34, respectively, at the first end 36. The cable 20 is electrically coupled to the electric vehicle 18 at a second end 52 of the cable 20. The second end 52 of the cable 20 can include a connector 53 configured to couple to an inlet (not shown) of the electric vehicle 18, for example, according to a standard currently published or under development such as the J1772, Mennekes, SCAME, NEMA 5-20, or NEMA 5-15R standards.

The cable 20 further includes a control pilot conductor 54 for communicatively coupling the EVSE control pilot circuit 44 to an EV control pilot circuit 56 in the electric vehicle 18. The EVSE control pilot circuit 44 and the EV control pilot circuit 56 facilitate communications between the EVSE 12 and the electric vehicle 18. For example, the EVSE control pilot circuit 44 and the EV control pilot circuit 56 can be configured to verify the mechanical connection of the EVSE 12 to the electric vehicle 18 via the cable 20, determine if the electric vehicle 18 requires ventilation for charging, verify whether the electric vehicle 18 is ready for charging, authorize the EVSE 12 to provide power to the electric vehicle 18, and/or allow the EVSE 12 to specify an available current to the electric vehicle 18 (e.g., a maximum amount of AC current available from the EVSE 12).

The cable 20 can also include a second CCID 58 configured to monitor a current differential between the current conducted on the first ungrounded cable conductor 48A, the second ungrounded cable conductor 48B, the grounded cable conductor 50, and the control pilot conductor 54. The second CCID 58 is further configured to cause an interruption of the current on at least one of the first ungrounded EVSE conductor 32A or the second ungrounded EVSE conductor 32B if a detected current differential exceeds the rated trip threshold of the second CCID 58. In the exemplary implementation of FIG. 1, the second CCID 58 has a rated trip threshold of 5 mA.

The electric vehicle 18 can include pure electric vehicles (EVs), plug-in hybrid electric vehicles (PHEVs), and/or any other type of vehicle that utilizes electric charging. Although the electric vehicle 18 is illustrated as a passenger automobile, it should be understood that the electric vehicle 18 can have other forms such as, for example, a bus, a truck, a van, a motorcycle, etc. As shown in FIG. 1, the electric vehicle 18 includes a chassis 60 to which the grounded cable conductor 50 can be electrically coupled (at a coupling point 62) to ground the electric vehicle 18, mitigating potentially hazardous shocks due to electrical current conducted to the chassis 60.

The electric vehicle 18 also includes a first ungrounded EV conductor 64A for electrically coupling to the first ungrounded cable conductor 48A, a second ungrounded EV conductor 64B for electrically coupling to the second ungrounded cable conductor 48B, and a grounded EV conductor 66 for electrically coupling to the grounded cable conductor 50. The first ungrounded EV conductor 64A and the second ungrounded EV conductor 64B are further electrically coupled to the power storage device 16 via a charge controller 68. The charge controller 68 can be configured, for example, to control the rate at which the power storage device 16 is charged, control the rate at which the power storage device 16 is drained, prevent overcharging, prevent overvoltage, and/or prevent the power storage device 16 from being completely drained.

Accordingly, as described above, the EVSE 12, the cable 20, and the electric vehicle 18 are electrically coupled via a plurality of conductors such that the power provided by the power source 14 to the EVSE 12 can be utilized to charge the power storage device 16 of the electric vehicle 18. That is, the power storage device 16 in the electric vehicle 18 can be charged by a first current conducted between the EVSE 12 and the power storage device 16 via the first ungrounded EVSE conductor 32A, the first ungrounded cable conductor 48A, and the first ungrounded EV conductor 64A, and a second current conducted between the electric vehicle 18 and the EVSE 12 via the second ungrounded EV conductor 64B, the second ungrounded cable conductor 48B, and the second ungrounded EVSE conductor 32B.

The supply of power from the EVSE 12 to the electric vehicle 18 is controlled by the trip mechanism 46 in the EVSE 12. That is, the trip mechanism 46 is configured to electrically connect and/or disconnect the electric vehicle 18 from the power source 14. In FIG. 1, the trip mechanism 46 is symbolically illustrated as a set of two switches operable according to a control signal to open or close one or more contact(s) on the first ungrounded EVSE conductor 32A and the second ungrounded EVSE conductor 32B; however, it is contemplated that other devices can be used to disconnect the electric vehicle 18 and/or the cable 20 from the power source 14. Additionally, although the trip mechanism 46 illustrated in FIG. 1 is configured to disconnect the current on both ungrounded EVSE conductors 32A, 32B, it is contemplated that, according to alternative aspects, the trip mechanism 46 can be configured to interrupt the current on the first ungrounded EVSE conductor 32A in the case where the second ungrounded EVSE conductor 32B is grounded.

The EVSE control pilot circuit 44 is communicatively coupled to the trip mechanism 46 and configured to provide a control signal to cause the trip mechanism 46 to connect and/or disconnect the contacts. For example, the EVSE control pilot circuit 44 can authorize the EVSE 12 to provide power to the electric vehicle 18 after verifying the electric vehicle 18 is ready for charging by providing a control signal to the trip mechanism 46, which causes the trip mechanism 46 to close the contacts on the ungrounded EVSE conductors 32A, 32B.

The first CCID 40 is communicatively coupled to the trip mechanism 46. The first CCID 40 can thus cause the trip mechanism 46 to interrupt the current on the first ungrounded EVSE conductor 32A and the second ungrounded EVSE conductor 32B in response to a detected current differential exceeding the rated trip threshold by generating and communicating a control signal to the trip mechanism 46 via the EVSE control pilot circuit 44. Although, in FIG. 1, the first CCID 40 is communicatively coupled to the trip mechanism 46 via the EVSE control pilot circuit 44, according to alternative aspects, the first CCID 40 can be configured to communicate the control signal directly to the trip mechanism 46 to disconnect the current on the first ungrounded EVSE conductor 32A and/or the second ungrounded EVSE conductor 32B.

The trip mechanism 46 is further communicatively coupled to the ground monitor circuit 42. The ground monitor circuit 42 monitors the grounding continuity on the line-side grounding conductors (e.g., the grounded power-source conductor 26 and/or the grounded EVSE conductor 34). The ground monitor circuit 42 is configured to cause an interruption of power from the power source 14 to the electric vehicle 18 (e.g., by communicating a control signal to the trip mechanism 46 via the EVSE control pilot circuit 44) if the impedance on the line-side grounding conductors exceeds a predetermined threshold value. Although, in FIG. 1, the ground monitor circuit 42 is communicatively coupled to the trip mechanism 46 via the EVSE control pilot circuit 44, according to alternative aspects, the ground monitor circuit 42 can be configured to communicate the control signal directly to the trip mechanism 46.

According to aspects of the present disclosure, the system 10 is conceptually divided into three different fault zones in which a potential ground fault can occur. Each fault zone is defined by where a potential ground fault within the zone originates and the conduction path that the potential ground fault takes to return to ground 30. A first zone includes potential ground faults that originate from an electrical component within the electric vehicle 18 (e.g., the power storage device 16, the first ungrounded EV conductor 64A, the second ungrounded EV conductor 64B, the charge controller 68, etc.) and return to the ground 30 via the chassis 60 of the electric vehicle 18. As a non-limiting example, a ground fault in the first zone can occur if the power storage device 16 becomes connected to the chassis 60 such that a ground fault current passes from the power storage device 16 through to the chassis 60 (where an operator could potentially be shocked) and then to the ground 30 (e.g., via the grounded cable conductor 50 coupled to the chassis 60 and the grounded EVSE conductor 34). FIG. 1 illustrates an exemplary first ground fault 70 occurring in the first fault zone that originates on the first ungrounded EV conductor 64A and returns to the ground 30 via the chassis 60 and the grounded cable conductor 50.

A second fault zone includes potential ground faults that originate from the cable 20 (e.g., from the first ungrounded cable conductor 48A or the second ungrounded cable conductor 48B) and return to the ground 30 via the chassis 60 of the electric vehicle 18. As one non-limiting example, a ground fault in the second zone can occur if the operator contacts the cable 20 and also contacts the chassis 60 such that a ground fault current passes from the cable 20 through the operator to the chassis 60 and then to ground 30 (e.g., via the grounded cable conductor 50 coupled to the chassis 60 and the grounded EVSE conductor 34). FIG. 1 illustrates an exemplary second ground fault 72 occurring in the second fault zone that originates on the first ungrounded cable conductor 48A and returns to the ground 30 via the chassis 60 and the grounded cable conductor 50.

A third zone includes potential ground faults that originate from the cable 20 and return directly to a ground 76 external to the system 10 (i.e., the ground faults of the third zone do not pass through the chassis 60 to the ground). As one non-limiting example, a ground fault in the third zone can occur if the operator contacts the cable 20 while standing in a wet puddle such that a ground fault current passes from the cable 20 through the operator directly to the ground. FIG. 1 illustrates an exemplary third ground fault 74 occurring in the third fault zone that originates on the first ungrounded EV conductor 64A and returns directly to the external ground 76.

The systems 10 of the present disclosure protect an operator from ground faults (e.g., the ground faults 70, 72, 74) at let-go current levels in all three of the zones, while advantageously allowing a leakage current originating in the electrical vehicle 18 to be detected at a higher current level for nuisance trip avoidance. To achieve this, the system 10 is configured to detect and protect against ground faults differently based on the zone in which the ground faults occur.

To facilitate a description of the detection of ground faults in each of the three fault zones by the system 10 illustrated in FIG. 1, the normal operating conditions of the system 10 will first be described. Under normal operating conditions, a first current is conducted between the power source 14 and the electric vehicle 18 via the conductors 24A, 32A, 48A, 64A while a second current is conducted between the electric vehicle 18 and the power source 14 via the conductors 24B, 32B, 48B, 64B. If no ground faults existed and no leakage current passed to the chassis 60, the first current would be approximately equal to and opposite of the second current. Accordingly, the first CCID 40 would not trip because the current detected by the first CCID 40 on the first ungrounded EVSE conductor 32A would be cancelled out by the current detected by the first CCID 40 on the second ungrounded EVSE conductor 32B (i.e., the first CCID 40 would detect substantially no current differential). Similarly, the second CCID 58 would not trip because the current detected by the second CCID 58 on the first ungrounded cable conductor 48A would be cancelled out by the current detected by the second CCID 58 on the second ungrounded EVSE conductor 32B.

When a ground fault occurs in the first fault zone, the ground fault is detected by the first CCID 40 at an effective trip threshold that is greater than the rated trip threshold of the first CCID 40. To illustrate the detection of a ground fault occurring in the first zone, the exemplary first ground fault 70 between the first ungrounded EV conductor 64A and the chassis 60 of the electric vehicle 18 is shown in FIG. 1. In response to the first ground fault 70, current normally conducted from the first ungrounded cable conductor 48A to the power storage device 16 is instead conducted to the chassis 60 of the vehicle 18. As a result, the current of the first ground fault 70 (i.e., the "fault current") is conducted to the ground 30 via the grounded cable conductor 50 (coupled to the chassis 60) instead of being conducted to the power source 14 via the second ungrounded cable conductor 48B.

Notably, at the EVSE 12, a part of the fault current conducted to ground 30, via the grounded cable conductor 50, is detected by the first CCID 40. As described above, a first portion of the current on the grounded cable conductor 50 is conducted to the ground 30 via the first grounded EVSE conductor 38A, and a second portion of the current on the grounded cable conductor 50 is conducted to the ground 30 via the second grounded EVSE conductor 38B. The first CCID 40 is configured to detect the first portion of the current on the grounded cable conductor 50 but not the second portion of the current on the grounded cable conductor 50. For example, as shown in FIG. 1, the first grounded EVSE conductor 38A and the second grounded EVSE conductor 38B can be configured such that the first grounded EVSE conductor 38A passes through the first CCID 40 and the second grounded EVSE conductor 38B bypasses the first CCID 40.

The first portion of the fault current on the first grounded EVSE conductor 38A reduces the current differential detected between the ungrounded EVSE conductors 32A, 32B, thus increasing the effective trip threshold of the first CCID 40 for detecting a first ground fault 70 in the first zone. For example, if the grounded EVSE conductors 32A, 32B were configured such that 71% of the current on the grounded cable conductor 50 passed through the first CCID 40 on the first grounded EVSE conductor 38A and 29% of the current on the grounded cable conductor 50 bypassed the first CCID 40 via the second grounded EVSE conductor 38B, the effective trip threshold of the first CCID 40 increases from 5 mA to approximately 17.2 mA (i.e., the effective trip threshold equals 5 mA/0.29). Accordingly, if a 17.2 mA current was provided on the first ungrounded cable conductor 48A from the EVSE 12 to charge the electric vehicle 18 and the first ground fault 70 occurred, the 17.2 mA current would be returned to the ground 30 on the grounded cable conductor 50 instead of the second ungrounded cable conductor 48B. The magnitude of this exemplary ground fault is thus 17.2 mA (i.e., the current differential between the ungrounded cable conductors 48A, 48B). However, because 12.2 mA of the fault current on the grounded cable conductor 50 is detected on the first grounded EVSE conductor 38A by the first CCID 40, the first CCID 40 only detects a current differential of 5 mA (i.e., the rated trip threshold of the first CCID 40) for a first ground fault 70 having a magnitude of 17.2 mA.

Advantageously, because a leakage current is conducted along a similar conductive path as the ground faults 70 in the first zone, the increased effective trip threshold of the first CCID 40 allows the leakage current to be ignored by the first CCID 40. That is, because the leakage current is conducted from an electrical component within the electric vehicle 18 to the ground 30 via the chassis 60 and the grounded cable conductor 50 (i.e., like a first ground fault 70 in the first zone), a portion of the leakage current will be detected by the first CCID 40 and be canceled out by other currents detected by the first CCID 40 on the ungrounded EVSE conductors 32A, 32B. Thus, the first CCID 40 has the same increased effective trip threshold for detecting leakage currents as for detecting fault currents due to ground faults 70 in the first zone. Therefore, the first CCID 40 will not trip for leakage currents below the increased effective trip threshold of the first CCID 40.

The amount the effective trip threshold of the first CCID 40 is increased is based on an impedance ratio of the first grounded EVSE conductor 38A and the second grounded EVSE conductor 38B. In other words, the impedance ratio of the first grounded EVSE conductor 38A and the second grounded EVSE conductor 38B determines the sensitivity of the first CCID 40 to both leakage current and ground faults 70 in the first zone. The impedance ratio can thus be configured to set the effective trip threshold at an appropriate level to mitigate nuisance tripping due to the leakage current.

According to one non-limiting example, the impedance ratio can be configured such that the effective trip threshold of the first CCID 40 matches a rating trip threshold of a CCID20 (i.e., a CCID having a rating trip threshold of 20 mA). As another non-limiting example, the impedance ratio can be configured such that 71% of the current on the grounded cable conductor 50 is passed through the first CCID 40 on the first grounded EVSE conductor 38A and 29% of the current on the grounded cable conductor 50 bypasses the first CCID 40, as described above. As yet another non-limiting example, the impedance ratio can be configured such that the effective trip threshold of the first CCID 40 is approximately 15 mA to approximately 20 mA for leakage current and ground faults 70 occurring in the first zone. It should be understood that there are presently no standards requirements limiting the leakage current to any particular range and, thus, it is contemplated that the effective trip threshold of the first CCID 40 can be set to other appropriate levels.

Because the effective trip threshold of the first CCID 40 is increased for ground faults in the first zone 70, in some instances, the first CCID 40 may not be configured to trip at let-go current levels. As such, the system 10 can include additional features to protect an operator from ground faults in the first zone 70 at let-go current levels. For example, the system 10 can be configured such that a continuous connection between the chassis 60 and the ground is maintained when power is provided to the electric vehicle 18 for charging. By providing a continuous connection from the chassis 60 to ground, an operator in contact with the chassis 60 (or other metallic surfaces electrically coupled to the chassis 60) is protected from receiving an electrical shock in response to a ground fault 70 in the first zone (i.e., the ground faults below the effective trip threshold of the first CCID 40 are shunted to ground 30).

In FIG. 1, the ground monitor circuit 42 and the control pilot circuits 44, 56 are configured to provide a continuous connection between the chassis 60 and the ground 30 when power is provided from the EVSE 12 to the electric vehicle 18. As explained above, the EVSE control pilot circuit 44 can be communicatively coupled to the trip mechanism 46, which is configured to control the power provided from the EVSE 12 to the electric vehicle 18. The control pilot circuits 44, 56 can be configured to monitor the impedance on the load side conductors (i.e., the grounded EVSE conductor 34 and/or the grounded cable conductor 50) and, if the impedance exceeds a predetermined threshold value, the control pilot circuits 44, 56 are configured to cause an interruption of the power being conducted from the power source 14 to the electric vehicle 18.

The ground monitor circuit 42 monitors the grounding continuity on the line-side grounding conductors (e.g., the grounded power-source conductor 26 and/or the grounded EVSE conductor 34). The ground monitor circuit 42 is configured to cause an interruption of power from the power source 14 to the electric vehicle 18 if the impedance on the line-side grounding conductors exceeds a predetermined threshold value. The combination of the control pilot circuits 44, 56 and the ground monitor circuit 42 thus provide a comprehensive ground monitor from the electric vehicle 18 to the ground 30 such that leakage currents and ground faults 70 occurring in the first fault zone below the effective trip threshold of the first CCID 40 are safely conducted back to the ground 30 through the grounding conductors 34, 50.

It is contemplated that, according to some aspects, the impedance ratio of the first grounded EVSE conductor 38A and the second grounded EVSE conductor 38B may be configured such that the ground monitor circuit 42 can ensure that the grounded cable conductor 50 impedance is sufficiently low to limit the voltage at the chassis 60 to an acceptable level. It is also contemplated that, according to alternative aspects of the present disclosure, the ground monitor circuit 42 may be omitted if the system 10 is otherwise configured to ensure a low impedance grounding path between the chassis 60 and the ground 30.

It should be understood that the second CCID 58 does not trip in response to leakage current or ground faults 70 occurring in the first fault zone because the current differential between the first ungrounded cable conductor 48A, the second ungrounded cable conductor 48B, the grounded cable conductor 50 and the control pilot conductor 54 does not exceed the rated current trip threshold level of the second CCID 58 (regardless of the magnitude of the current of the first ground fault 70). This is because the current that normally would have been detected by the second CCID 58 on the second ungrounded cable conductor 48B is instead detected by the second CCID 58 on the grounded cable conductor 50 in response to the first ground fault 70 or leakage currents. In other words, at the second CCID 58, the current conducted from the EVSE 12 to the electric vehicle 18 on the first ungrounded cable conductor 48A is canceled out by the current returned to the EVSE 12 on the second ungrounded cable conductor 48B and the grounded cable conductor 50 in response to the first ground fault 70 or the leakage current.

In the second zone, the system 10 detects and protects an operator from the occurrence of a ground fault by the second CCID 58. To illustrate the detection of a ground fault occurring in the second zone, the exemplary second ground fault 72 between the first ungrounded cable conductor 48A and the chassis 60 of the electric vehicle 18 is shown in FIG. 1. In response to the second ground fault 72, current normally conducted through the second CCID 58 on the first ungrounded cable conductor 48A is instead conducted around the second CCID 58 to the chassis 60 of the electric vehicle 18. For example, as shown in FIG. 1, the second ground fault 72 is conducted from the first ungrounded cable conductor 48A above and around the second CCID 58 to the chassis 60 of the electric vehicle 18. The fault current is then conducted to the ground 30 via the grounded cable conductor 50 (coupled to the chassis 60). The absence of the fault current on the first ungrounded cable conductor 48A and the presence of the fault current on the grounded cable conductor 50, results in a current differential detected by the second CCID 58. Because the second CCID 58 is configured to cause an interruption of power at a current level (e.g., 5 mA) below the maximum let-go level, an operator is protected from ground faults 72 occurring in the second zone at let-go current levels.

According to some aspects of the present disclosure, the second CCID 58 can be located in the cable 20 on the line side (i.e., the side towards the power source 14) of the coupling 62 between the grounded cable conductor 50 and the vehicle 18 to mitigate the potential risk of a ground fault 72 in the second zone not being detected by the second CCID 58 (e.g., due to the ground fault 72 originating from a location on the cable 20 between the second CCID 58 and the interface point 62 between the grounded cable conductor 50 and the chassis 60). It should understood that the closer the second CCID 58 is located to the interface point 62, the lower the risk that a second ground fault 72 can occur in the second zone outside the detection of the second CCID 58. Thus, the second CCID 58 can be located at or adjacent to the electric vehicle 18 (e.g., in a connector 53 at the second end 52 of the cable 20 or, as described below with respect to FIG. 3, in the electric vehicle 18).

While the first CCID 40 is located at the EVSE 12 and communicatively coupled to the trip mechanism 46 to interrupt the flow of power from the power source 14 to the electric vehicle 18 when a detected current differential exceeds the trip threshold, the second CCID 58 is located in the cable 20. According some aspects of the present disclosure, the second CCID 58 can be configured to cause, via the control pilot circuits 44, 56, the trip mechanism 46 to interrupt the power flowing from the power source 14 to the electric vehicle 18. For example, the second CCID 58 can be configured to cause a short between the grounded cable conductor 50 and the control pilot conductor 54 in the cable 20. In the exemplary implementation illustrated in FIG. 1, the cable 20 includes a switch 78 communicatively coupled to the second CCID 58 and configured to short the grounded cable conductor 50 and the control pilot conductor 54. When the control pilot conductor 54 is shorted to the grounded cable conductor 50, the voltage at the control pilot circuits 44, 56 is 0 V. This voltage is evaluated by the control pilot circuits 44, 56 as a fault condition, which causes the EVSE control pilot circuit 44 to provide a control signal to the trip mechanism 46 to disconnect the power flowing from the power source 14 to the electric vehicle 18. It is contemplated that, according to some aspects, the control pilot circuits 44, 56 can include hardware, firmware, or both that detects the shorting of the control pilot conductor 54 and the grounded cable conductor 50 as an indication of a ground fault.

Once the power is disconnected, the second CCID 58 loses power, automatically resetting, and opening the switch 78 so the control pilot conductor 54 is no longer shorted to the grounded cable conductor 50. It should be understood that, according to additional and/or alternative implementations, the control pilot conductor 54 can be shorted to the grounded cable conductor 50 by other solid state and/or mechanical devices (e.g., a transistor, a solenoid, etc.).

In the third zone, the system 10 detects and protects an operator from the occurrence of a ground fault by the first CCID 40. To illustrate the detection of a ground fault occurring in the third zone, an exemplary third ground fault 74 between the first ungrounded cable conductor 48A and a ground external 76 to the system 10 is shown in FIG. 1. In response to the third ground fault 74, the fault current returns to ground outside of the first CCID 40 (i.e., the current from the third ground fault 74 does not return on the second ungrounded cable conductor 48B or the grounded cable conductor 50). Notably, because no portion of the fault current is detected by the first CCID 40 on the first grounded EVSE conductor 38A, the trip threshold of the first CCID 40 is not increased for ground faults 74 occurring in the third zone. Thus, the first CCID 40 detects a ground fault 74 in the third zone at the rating trip threshold of the first CCID 40. Additionally, because the first CCID 40 is configured to cause an interruption of power from the power source 14 to the electric vehicle 18 at a current level (e.g., 5 mA) below the maximum let-go level, an operator is protected from ground faults 74 occurring in the third zone at let-go current levels.

Accordingly, as described above, the system 10 is configured to detect and protect against ground faults based on the zone in which the ground faults occur. In the first zone, the first CCID 40 detects ground faults 70 at an effective trip threshold that is greater than the rated trip threshold of the first CCID 40. Leakage currents are similarly detected at an effective trip threshold that is greater than the rated trip threshold of the first CCID 40, mitigating undesirable nuisance tripping. Protection against ground faults 70 is provided by the ground monitor circuit 42 and/or the control pilot circuits 44, 56 causing an interruption of power from the power source 14 to the electric vehicle 18 if the ground continuity is not present. In the second zone, the second CCID 58 detects and protects against ground faults 72 at the rated trip threshold, which is at let-go current levels. In the third zone, the first CCID 40 detects and protects against ground faults 74 at the rated trip threshold, which is at let-go current level. Thus, the system 10 advantageously allows for charging of high-leakage or aging vehicles that otherwise could not be safely charged (i.e., at let-go current levels) or without difficulty due to excessive nuisance tripping.

Figure 2:
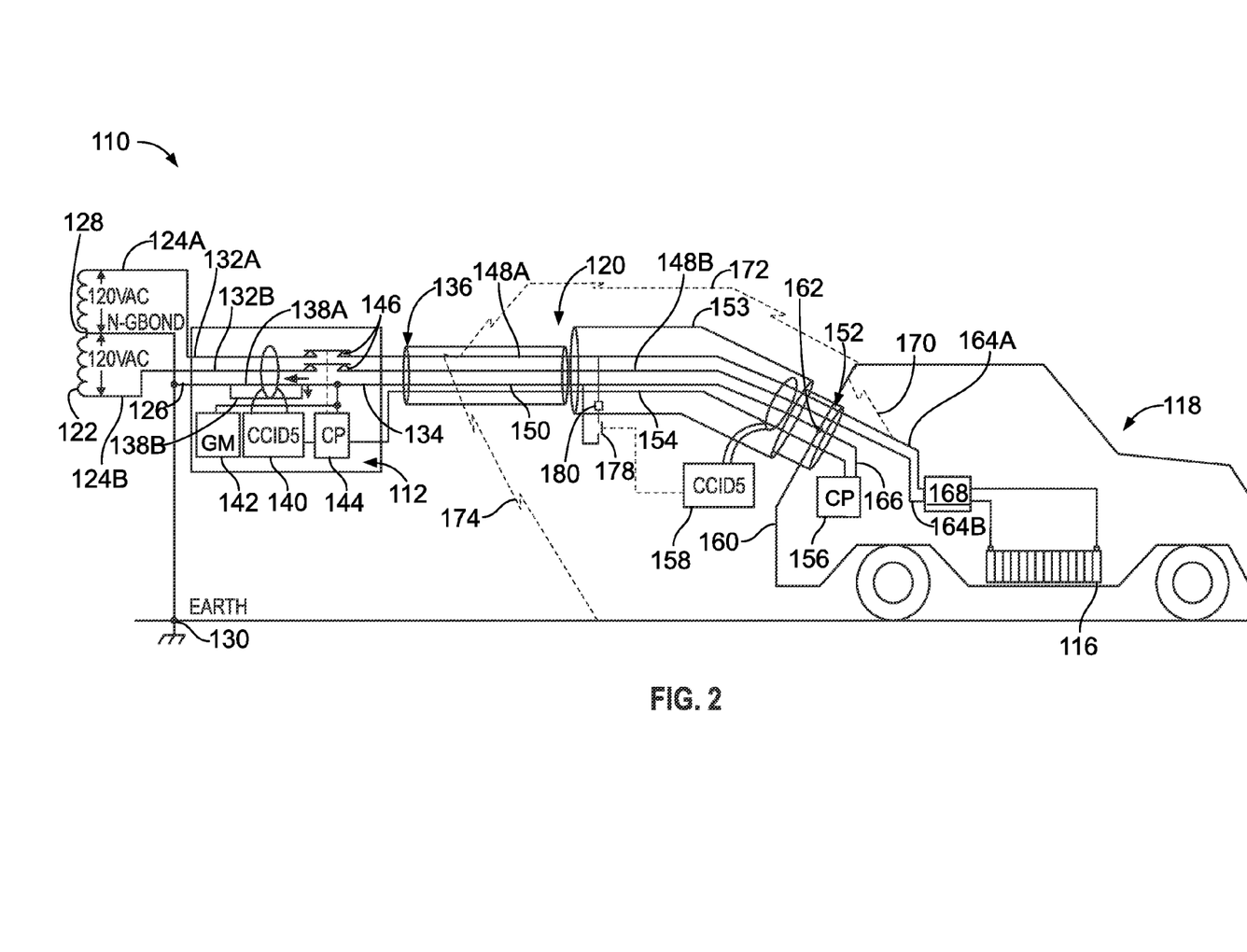
FIG. 2 is a functional diagram of an exemplary zone fault detection system according to additional and/or alternative aspects of the present disclosure.

Referring now to FIG. 2, wherein similar reference numerals refer to similar components from the other figures, a zone fault detection system 110 according to additional and/or alternative aspects of the present disclosure is illustrated. The system 110 of FIG. 2 is substantially similar to the system 10 described and illustrated with respect to FIG. 1; however, the system 110 of FIG. 2 differs in its configuration for causing an interruption to the power flowing from the power source 114 to the electric vehicle 118 in response to a ground fault 172 in the second zone detected by the second CCID 158.

In FIG. 1, the second CCID 58 was configured to cause the control pilot conductor 54 to be shorted to the grounded cable conductor 50 so that the control pilot circuits 44, 56 could determine the occurrence of a ground fault and cause the trip mechanism 46 to disconnect the power. By contrast, in FIG. 2, the second CCID 158 is configured to cause a fault that can be detected by the first CCID 140. For example, in FIG. 2, the cable 120 includes a switch 178 configured to selectively couple the grounded cable conductor 150 to the first ungrounded cable conductor 148A via a resistor 180. When the grounded cable conductor 150 is coupled to the first ungrounded cable conductor 148A, a portion of the current that would normally be conducted to the EVSE 112 on the second ungrounded cable conductor 148B is instead conducted to the EVSE 112 on the grounded cable conductor 150. The resistor 180 can be configured to draw an amount of current to the grounded cable conductor 150 that is sufficient to cause a current differential above the effective trip threshold of the first CCID 140. As one non-limiting example, the resistor 180 can be configured to draw approximately 30 mA of current from the first ungrounded cable conductor 148A, a portion of which bypasses the first CCID 40, creating a current differential that causes the first CCID 40 to provide a control signal to the trip mechanism 46 to interrupt the power. As another non-limiting example, the resistor 180 can have an impedance less than approximately 5 kΩ.

Figure 3:
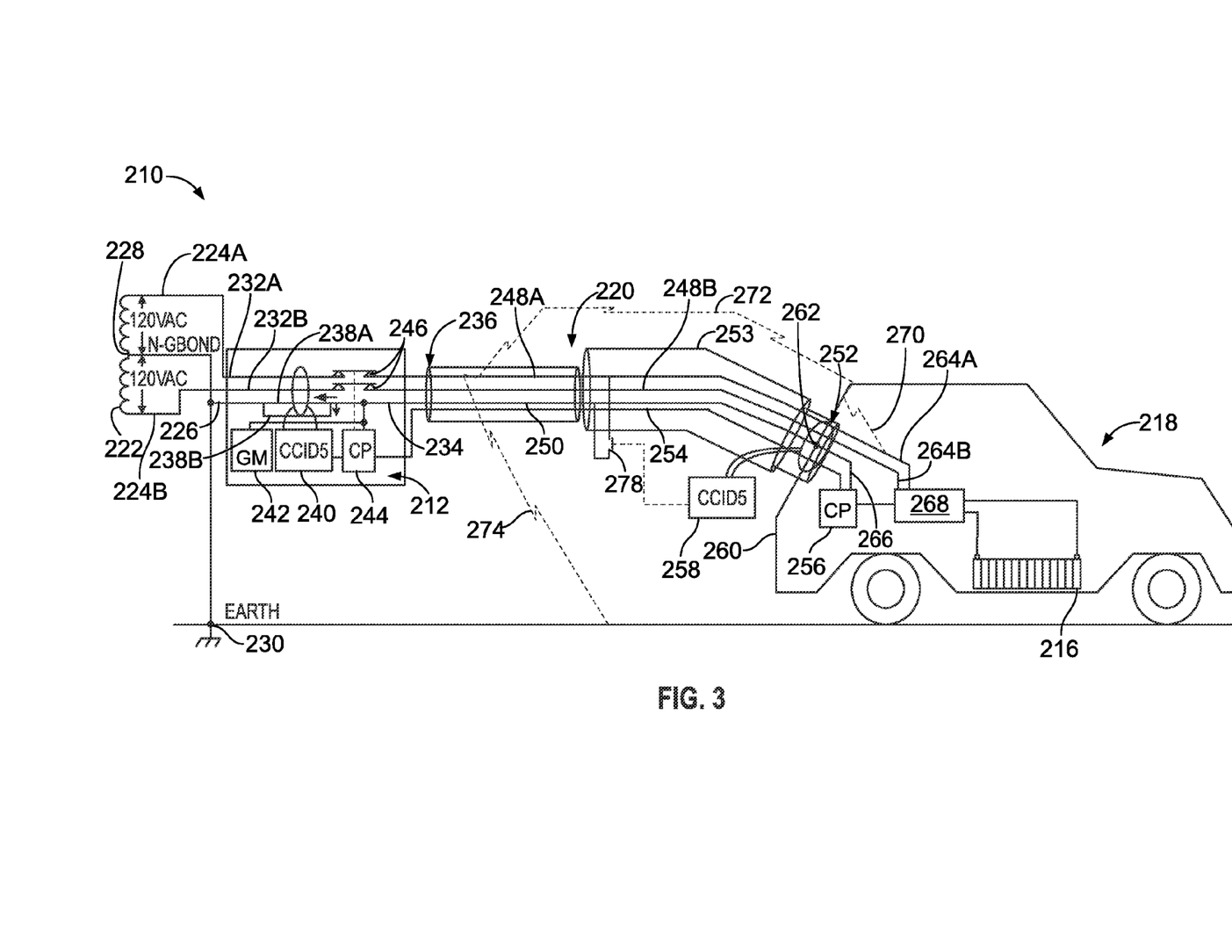
FIG. 3 is a functional diagram of an exemplary zone fault detection system according to additional and/or alternative aspects of the present disclosure.

Referring now to FIG. 3, wherein similar reference numerals refer to similar components from the other figures, a zone fault detection system 210 according to additional and/or alternative aspects of the present disclosure is illustrated. The system 210 of FIG. 3 is substantially similar to the system 10 described and illustrated with respect to FIG. 1; however, the system 210 of FIG. 3 differs in that the second CCID 258 is located within the electric vehicle 218 instead of the cable 220. To ensure that ground faults 272 occurring in the second zone are detected by the second CCID 258 located in the electric vehicle 218, the second CCID 258 is located in the electric vehicle 218 on the line side of the coupling 262 between grounded cable conductor 250 and the chassis 260 of the electric vehicle 218. The second CCID 258 can be configured to interrupt the power flowing from the power source 214 to the electric vehicle 218, for example, as described with respect to FIG. 1 (i.e., shorting the control pilot conductor 254 to the grounded cable conductor 250) and/or FIG. 2 (i.e., coupling one of the ungrounded cable conductors 248A, 248B to the grounded cable conductor 250 to cause the first CCID 240 to detect a ground fault 272). Alternatively, the second CCID 258 can be configured to short a control pilot conductor in the electric vehicle 218 to the grounded EV conductor 266 and/or couple an ungrounded EV conductor 64A, 64B to the grounded EV conductor 266).

Figure 4:
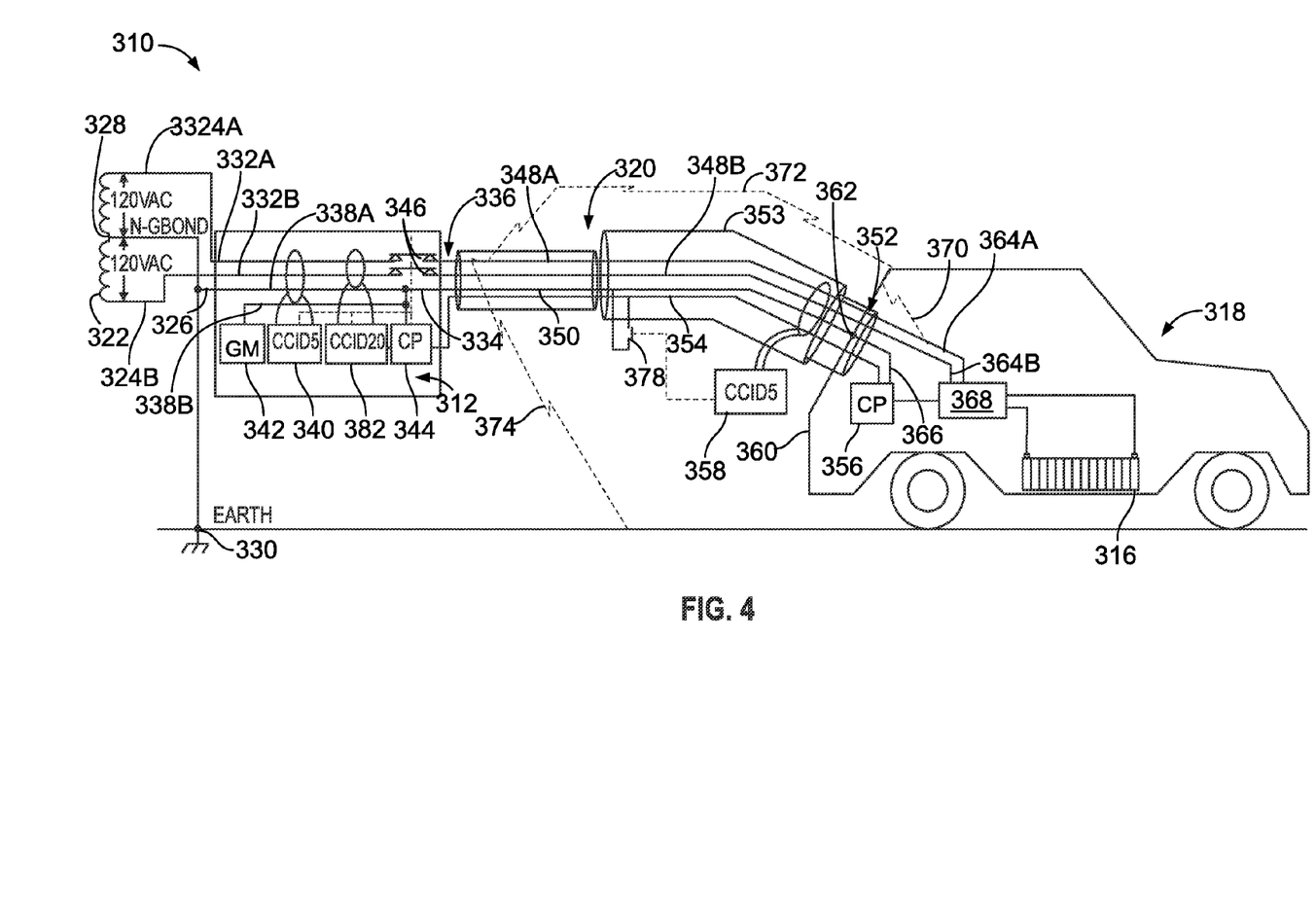
FIG. 4 is a functional diagram of an exemplary zone fault detection system according to additional and/or alternative aspects of the present disclosure.

Referring now to FIG. 4, wherein similar reference numerals refer to similar components from the other figures, a zone fault detection system 310 according to still additional and/or alternative aspects of the present disclosure is illustrated. The system 310 of FIG. 4 differs from the system 10 illustrated in FIG. 1 in two respects. First, in FIG. 4, the first CCID 340 is configured to detect the entire current on the grounded EVSE conductor 334. Second, in FIG. 4, the EVSE 312 also includes a third CCID device 382 configured to detect a current differential between the currents on the first ungrounded EVSE conductor 332A and the second ungrounded EVSE conductor 332B.

In response to a first ground fault 370 occurring in the first zone, the fault current is conducted to the ground 330 via the grounded cable conductor 350 instead of the second ungrounded cable conductor 348B. At the EVSE 312, the first CCID 340 is not tripped due to a ground fault in the first zone because the entire fault current is detected by the first CCID 340 on the grounded EVSE conductor 334. As such, the first CCID 340 is configured to ignore or not detect a ground fault 370 occurring in the first zone.

Instead, a ground fault 370 occurring in the first zone is detected by the third CCID 382 at a rated trip threshold of the third CCID 382. Accordingly, the third CCID 382 can have a rated trip threshold that is configured to mitigate nuisance tripping due to leakage current flowing from the electric vehicle 318 on the grounded cable conductor 350. In one non-limiting implementation, the third CCID 382 can have a rated trip threshold of 20 mA. As described above, the system 310 is configured to provide a continuous connection to ground to protect against ground faults 370 in the first fault zone.

A ground fault 372 occurring in the second zone can be detected and protected by the second CCID 358 as described above with respect to FIGS. 1-3. A ground fault 374 occurring in the third zone is detected by the first CCID 340. Because a ground fault 374 occurring in the third zone is returned directly to ground 376, no fault current is detected by the first CCID 340 as described above for the ground faults 374 occurring in the third zone with respect to FIG. 1. Because both the first CCID 340 and the second CCID 358 have rated trip thresholds that are below the maximum let-go level, the system 310 is configured to protect against ground faults in the second zone and the third zone at let-go levels.

Figure 5:
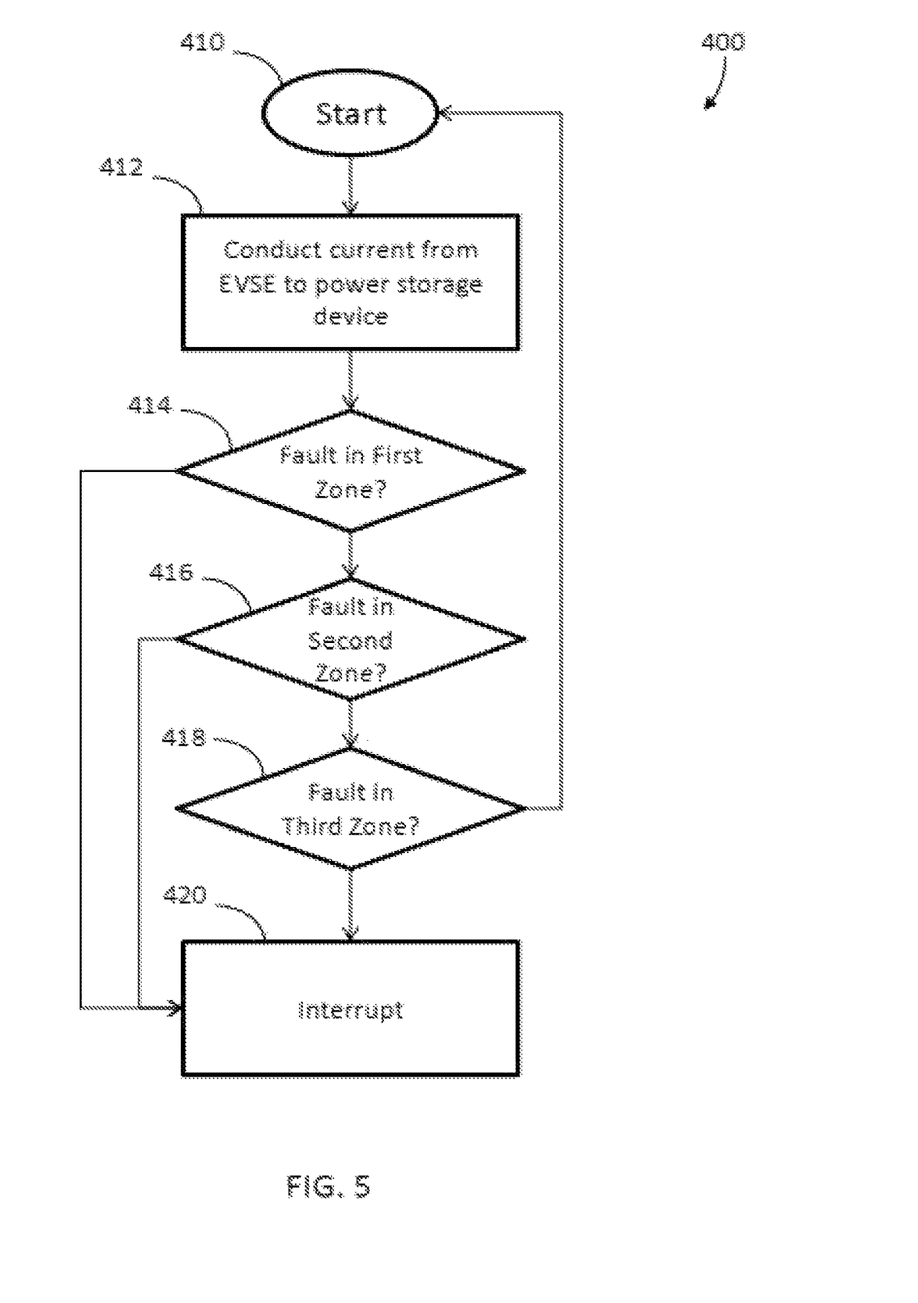
FIG. 5 is a flowchart of an exemplary process for providing zone fault detection for an electric vehicle being charged by an electric vehicle supply according to an aspect of the present disclosure.

Referring now to FIG. 5, a flowchart of a process 400 for providing zone fault detection for an electric vehicle 18 being charged by an EVSE 12 is illustrated. At block 410, the process 400 is initiated. At block 412, an electrical current is conducted from an EVSE 12 to a power storage device 16 of an electric vehicle 18 via a cable coupled to the EVSE 12 to charge the power storage device 16. At decision block 414, it is determined whether a first fault 70 has occurred in the first zone by a first CCID 40 at the EVSE 12. If it is determined that a first fault 70 has occurred in the first zone, the process proceeds to block 420. Otherwise, the process 400 proceeds to block 416. At decision block 416, it is determined whether a second fault 72 has occurred in the second zone by a second CCID 58. If it is determined that a second fault 72 has occurred in the second zone, the process proceeds to block 420. Otherwise, the process 400 proceeds to block 418. At decision block 418, it is determined whether a third fault 74 has occurred in the third zone by the first CCID 40. If it is determined that a third fault has occurred in the third zone, the process proceeds to block 420. Otherwise, the process 400 returns to block 410. At block 420, the conduction of electrical current from the EVSE to the power storage device is interrupted.

It will be appreciated by those skilled in the art that some of the steps for the process of providing zone fault detection for an electric vehicle 18 being charged by an EVSE 12 can be performed in a different order than that described above.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims. As one non-limiting example, it is contemplated that the rated trip threshold values of the CCIDs can have different values than those described above. Additionally, it is contemplated that, according to alternative aspects, the zone fault detection systems and methods of the present disclosure can be applied to electric equipment (or electrical loads) having leakage currents other than electric vehicles. In such alternative aspects, the EVSE can be replaced by an electrical box, a circuit breaker, or outlet device including at least a CCID device and a trip mechanism (and optionally other components such as, e.g., a ground monitor).

What is claimed is:

1. A system for detecting faults in an electric vehicle charging system, the system comprising:
    an electric vehicle supply equipment (EVSE);
    a cable for electrically coupling the EVSE to a power storage device located in an electric vehicle, the cable including a first ungrounded cable conductor and a second ungrounded cable conductor each conducting a respective current between the EVSE and the power storage device to charge the power storage device, the cable further including a grounded cable conductor for conducting electrical current from the vehicle to a ground at the EVSE; and
    a first charging circuit interrupting device (CCID) at the EVSE, the first CCID being configured to monitor a current differential between the current conducted on the first ungrounded cable conductor, the current conducted on the second ungrounded cable conductor, and a first portion of the current conducted on the grounded cable conductor, the EVSE being configured such that a second portion of the current conducted on the grounded cable conductor bypasses the first CCID.

2. The system of claim 1, wherein the EVSE includes a first grounded EVSE conductor and a second grounded EVSE conductor electrically coupled to the grounded cable conductor of the cable, the first portion of the current on the grounded cable conductor being conducted to ground via the first grounded EVSE conductor, the second portion of the current on the grounded cable conductor being conducted to ground via the second grounded EVSE conductor, the first grounded EVSE conductor being in electrical communication with the first CCID such that the first portion of the current on the grounded cable conductor is monitored by the first CCID, wherein the second portion of the current on the grounded cable conductor being conducted to ground via the second grounded EVSE conductor bypasses the first CCID.

3. The system of claim 2, wherein the first CCID is configured to cause an interruption of current on at least one of the first ungrounded cable conductor or the second ungrounded cable conductor in response to the current differential being greater than a threshold limit.

4. The system of claim 3, wherein the first grounded EVSE conductor and the second grounded EVSE conductor have respective impedances configured such that a leakage current conducted from the vehicle to the ground on the grounded cable conductor does not cause the first CCID to interrupt the current on the first ungrounded cable conductor and the second ungrounded cable conductor.

5. The system of claim 4, wherein the threshold limit is approximately 5 mA.

6. The system of claim 5, wherein the leakage current is between just above the threshold limit to approximately 15 mA.

7. The system of claim 1, wherein the grounded cable conductor is electrically coupled to a chassis of the vehicle.

8. The system of claim 7, further comprising a ground monitoring device configured to determine whether the grounded cable conductor is coupled to the ground and, if the grounded cable conductor is determined to not be coupled to ground, to cause an interruption of current on the first ungrounded cable conductor and the second ungrounded cable conductor.

9. The system of claim 1, further comprising a second CCID located in the cable.

10. The system of claim 9, further comprising a first control pilot circuit located at the EVSE and a second control pilot circuit located at the vehicle, the first control pilot circuit being communicatively coupled to the second control pilot circuit via a control pilot conductor in the cable and the grounded cable conductor in the cable, the second CCID being configured to monitor a current differential between the first ungrounded cable conductor, the second ungrounded cable conductor, the grounded cable conductor, and the control pilot conductor.

11. The system of claim 10, wherein the second CCID is configured to cause the control pilot conductor to be shorted to the grounded cable conductor to cause the EVSE to interrupt the current on the first ungrounded cable conductor and the second ungrounded cable conductor.

12. The system of claim 10, wherein the second CCID is configured to cause the grounded cable conductor to be coupled via a resistor to at least one of the first ungrounded cable conductor or the second ungrounded cable conductor to cause the EVSE to interrupt the current on the first ungrounded cable conductor and the second ungrounded cable conductor.

13. The system of claim 1, further comprising a second CCID located in the vehicle.

14. The system of claim 1, further comprising a power source configured to provide one of a 120 $V_{AC}$, a 240 $V_{AC}$, and a three-phase power to the EVSE.

15. A method of providing zone fault detection for an electric vehicle being charged by an electric vehicle supply equipment (EVSE), the method comprising:
  conducting an electrical current from an EVSE to a power storage device of an electric vehicle via a cable coupled to the EVSE to charge the power storage device;
  detecting whether a first fault has occurred in a first zone by a first charging circuit interrupting device (CCID) at the EVSE, the first zone being between the power storage device and a chassis of the electric vehicle;
  detecting whether a second fault has occurred in a second zone by a second CCID, the second zone being between an ungrounded conductor in the cable and the chassis of the vehicle;
  detecting whether a third fault has occurred in a third zone by the first CCID, the third zone being between the ungrounded conductor in the cable and a ground external to the EVSE, the cable, and the vehicle; and
  interrupting the conduction of electrical current from the EVSE to the power storage device in response to an occurrence of at least one of the first fault, the second fault, or the third fault being detected.

16. The method of claim 15, wherein the first CCID is configured to cause the interruption of electrical current in response to the first fault being greater than approximately 15 mA, the first CCID being further configured to cause the interruption in response to the third fault being greater than approximately 5 mA, and the second CCID is configured to cause the interruption in response to the second fault being greater than approximately 5 mA.

17. The method of claim 15, wherein the first CCID is configured to cause the interruption of electrical current in response to the first fault being greater than a maximum leakage current level, the first CCID being further configured to cause the interruption in response to the third fault being greater than a let-go level, and the second CCID is configured to cause the interruption in response to the second fault being greater than the let-go level.

18. The method of claim 15, further comprising:
  conducting electrical current in response to the first fault from the chassis to a ground at the EVSE via a grounded conductor in the cable coupled to the chassis;
  conducting a first portion of the electrical current in response to the first fault to the ground through the first CCID; and
  conducting a second portion of the electrical current in response to the first fault to bypass the first CCID to the ground.

19. The method of claim 15, wherein the first CCID includes two first charging circuit interrupting devices, the method further comprising:
  monitoring, via one of the two first charging circuit interrupting devices, a current differential between the current conducted on a plurality ungrounded conductors in the cable; and
  monitoring, via the other of the two first charging circuit interrupting devices, a current differential between the current conducted on the plurality of ungrounded conductors in the cable and the current conducted on a grounded conductor in the cable.

20. A system for detecting faults in an electric vehicle charging system, the system comprising:
  an electric vehicle supply equipment (EVSE);
  a cable electrically coupling the EVSE to an electric vehicle, the cable including a first ungrounded cable conductor and a second ungrounded cable conductor each conducting a respective current between the EVSE and the electric vehicle to charge a power storage device located in the electric vehicle, the cable further including a grounded cable conductor for conducting electrical current from the electric vehicle to a ground at the EVSE;
  a first control pilot circuit located at the EVSE;
  a second control pilot circuit located at the electric vehicle, the first control pilot circuit being communicatively coupled to the second control pilot circuit via a control pilot conductor in the cable and the grounded cable conductor in the cable;

a first charging circuit interrupting device (CCID) at the EVSE, the first CCID being configured to monitor a current differential between the current conducted on the first ungrounded cable conductor and the current conducted on the second ungrounded cable conductor;

a second CCID at the EVSE, the second CCID being configured to monitor a current differential between the current conducted on the first ungrounded cable conductor, the current conducted on the second ungrounded cable conductor, and the current conducted on the grounded cable conductor; and a third CCID located in the cable, the third CCID being configured to monitor a current differential between the first ungrounded cable conductor, the second ungrounded cable conductor, the grounded cable conductor, and the control pilot conductor.

* * * * *